US010910139B1

(12) United States Patent
Folker et al.

(10) Patent No.: US 10,910,139 B1
(45) Date of Patent: Feb. 2, 2021

(54) COMPACT COMMON MODE CHOKE WITH DIFFERENTIAL NOISE SUPPRESSION AND HIGH SELF RESONANT FREQUENCY

(71) Applicant: Universal Lighting Technologies, Inc., Madison, AL (US)

(72) Inventors: Donald Folker, Madison, AL (US); Mike LeBlanc, Huntsville, AL (US)

(73) Assignee: Universal Lighting Technologies, Inc., Madison, AL (US)

( * ) Notice: Subject to any disclaimer, the term of this patent is extended or adjusted under 35 U.S.C. 154(b) by 340 days.

(21) Appl. No.: 15/897,354

(22) Filed: Feb. 15, 2018

Related U.S. Application Data

(60) Provisional application No. 62/464,099, filed on Feb. 27, 2017.

(51) Int. Cl.
*H01F 27/24* (2006.01)
*H01F 27/32* (2006.01)
*H03H 1/00* (2006.01)
*H01F 41/02* (2006.01)

(52) U.S. Cl.
CPC .......... *H01F 27/24* (2013.01); *H01F 27/325* (2013.01); *H01F 41/0206* (2013.01); *H03H 1/00* (2013.01); *H03H 2001/0092* (2013.01)

(58) Field of Classification Search
CPC .... H01F 27/325; H01F 5/02; H01F 2005/022; H01F 2005/025; H01F 2005/027; H01F 2005/046; H01F 27/24
USPC ........ 336/196, 198, 199, 208, 212, 220, 221
See application file for complete search history.

(56) References Cited

U.S. PATENT DOCUMENTS

| 4,352,081 A | * | 9/1982 | Kijima | H01F 27/306 336/198 |
| 5,731,666 A | * | 3/1998 | Folker | H05B 41/28 315/276 |
| 5,760,670 A | * | 6/1998 | Yeh | H01F 27/24 336/134 |
| 6,919,788 B2 | * | 7/2005 | Holdahl | H01F 3/14 336/192 |
| 9,799,442 B1 | | 10/2017 | Folker et al. | |
| 9,842,683 B1 | | 12/2017 | LeBlanc et al. | |

(Continued)

FOREIGN PATENT DOCUMENTS

| JP | 03252112 A | * | 11/1991 |
| JP | 07230919 A | * | 8/1995 |

*Primary Examiner* — Tszfung J Chan
(74) *Attorney, Agent, or Firm* — Patterson Intellectual Property Law, P.C.; Gary L. Montle; Jerry Turner Sewell

(57) ABSTRACT

A common mode choke assembly includes a main core, a shunt core, and first and second two-piece bobbins. The main core has a generally rectangular main core body, and first and second core riser portions. The first and second core riser portions are connected to opposite ends of the main core body. The first core riser portion includes a first riser notch and the second core riser portion includes a second riser notch aligned with the first riser notch. The shunt core spans between and is positioned within the first and second riser notches. The first and second two-piece bobbins are positioned on opposite sides of the main core body adjacent to the first and second core riser portions. Each two-piece bobbin includes at least first and second end flanges, a passageway, and a mating surface. The assembly further includes a mounting header for receiving the main and shunt core.

7 Claims, 8 Drawing Sheets

(56) References Cited

U.S. PATENT DOCUMENTS

| | | | | |
|---|---|---|---|---|
| 2006/0244562 A1* | 11/2006 | Johnson | ............... | H01F 27/263 |
| | | | | 336/234 |
| 2007/0216511 A1* | 9/2007 | Tseng | ..................... | H01F 38/10 |
| | | | | 336/208 |
| 2013/0257578 A1* | 10/2013 | Carsten | .................... | H01F 3/14 |
| | | | | 336/233 |
| 2017/0178784 A1* | 6/2017 | Janis | ...................... | H01F 41/04 |

* cited by examiner

COMPACT COMMON MODE CHOKE WITH DIFFERENTIAL NOISE SUPPRESSION AND HIGH SELF RESONANT FREQUENCY

A portion of the disclosure of this patent document contains material that is subject to copyright protection. The copyright owner has no objection to the reproduction of the patent document or the patent disclosure, as it appears in the U.S. Patent and Trademark Office patent file or records, but otherwise reserves all copyright rights whatsoever.

CROSS-REFERENCES TO RELATED APPLICATIONS

This application claims benefit of the following patent application(s) which is/are hereby incorporated by reference: U.S. Provisional Application No. 62/464,099 filed Feb. 27, 2017, entitled "Compact Common Mode Choke with Differential Noise Suppression and High Self Resonant Frequency."

FIELD OF THE INVENTION

The present disclosure relates generally to transformers and methods for making transformers. More particularly, the present disclosure relates to common mode choke assemblies with wound cores for differential noise suppression and high self-resonant frequency.

BACKGROUND OF THE INVENTION

A choke is an inductor used to block higher-frequency alternative current (AC) in an electrical circuit, while passing lower frequency or direct current (DC). A choke usually includes a coil of insulated wire. The coil is often wound on a on a magnetic core. The choke's impedance increases with frequency. A magnetic core can increase the inductance of a coil by a factor of several thousand by increasing the magnetic field due to its higher magnetic permeability.

Certain known common mode choke assemblies are made with two high permeability ferrite E-cores and a gapped ferrite core for differential noise suppression. Common mode choke assemblies are also made with toroidal one piece high permeability ferrite cores; however, single piece toroidal cores do not have a shunt path for noise suppression. E-cores and toroidal cores present difficulties in winding the coils onto the cores.

BRIEF SUMMARY OF THE INVENTION

Accordingly, there exists a need for a compact high performance common mode choke with differential noise suppression and high self-resonant frequency. There also exists a need for a common mode choke that is easy to wind.

One embodiment disclosed herein is a new core assembly structure. The core assembly includes a main core and a shunt core. The main core has a generally rectangular main core body. The main core body comprises a first main core end section, a second main core end section, a first main core leg section, and a second main leg core section. The first main core end section and the second main core end section are parallel to each other and parallel to a first direction. The first and second main core end sections are spaced apart in a second direction. The second direction is orthogonal to the first direction. The first main core end section has a first inner surface and a first outer surface. The second main core end section has a second inner surface and a second outer surface. The first main core leg section and the second main core leg section are parallel to the second direction and are spaced apart along the first direction. Each of the first and second main core leg sections extends from the first inner surface of the first main core end section to the second inner surface of the second main core end section. The first and second main core leg sections have a core leg cross-sectional profile. The main core further includes a first core riser portion and a second core riser portion. The first core riser portion extends perpendicularly downward from the first main core end section in a third direction. The third direction is orthogonal to the first direction and orthogonal to the second direction. The first core riser portion includes a first notch. The second core riser portion extends perpendicularly downward from the second main core end section in the third direction. The second core riser portion has a second notch. The second notch is in alignment with the first notch. The first and second notches have a core riser notch profile. The shunt core has a length. The length is selected so that the shunt core extends from the first outer surface of the first main core end section to the second outer surface of the second main core end section. The shunt core has a cross-sectional shunt profile configured to conform to the core riser notch profile.

In certain embodiments, the core riser notch profile of the core assembly is trapezoidal and the cross-sectional shunt profile is trapezoidal.

In certain embodiments, the shunt core of the core assembly fits snugly within the first and second core riser notches.

In certain embodiments, the shunt core of the core assembly is integrally formed from iron powder material configured to create a distributed magnetic gap.

In certain embodiments of the core assembly, the main core, including the first and second main core end portions, the first and second main core leg portions, and the first and second core risers, is integrally formed from a ferrite material.

In certain embodiments of the core assembly, the first core riser has a first core riser outer surface. The first core riser outer surface is aligned with the first outer surface of the first main core end section. The second core riser has a second core riser outer surface. The second core riser outer surface is aligned with the second outer surface of the second main core end section.

In certain embodiments of the core assembly, the core leg cross-sectional profile is octagonal.

In certain embodiments of the core assembly, the core leg cross-sectional profile is generally square with four beveled edges.

Another embodiment disclosed herein is a new structure for a common mode choke assembly. The common mode choke assembly includes a main core, a shunt core, a first bobbin assembly, and a second bobbin assembly. The main core has a generally rectangular main core body. The main core body includes a first main core end section and a second main core end section. The second main core end section is parallel to and spaced apart from the first main core end section. The main core body further includes a first main core leg section and a second main core leg section. The first and second main core leg sections are parallel to and spaced apart from each other. Each of the first and second main core leg sections extends perpendicularly from a first inner surface of the first main core end section to a second inner surface of the second main core end section. The main core body further includes a first core riser and a second core riser. The first core riser extends perpendicularly downward from the first main core end section. The first core riser has a first core riser notch. The second core riser extends perpendicularly downward from the second main core end section. The second core riser has a second core riser notch. The second core riser notch is in alignment with the first core riser notch. The shunt core is configured to be positioned within the first and second core riser notches. The shunt core has a length selected to extend from a first outer surface of the first core riser to a second outer surface of the second core riser. The first bobbin assembly is positioned around the first main core leg section. The second bobbin assembly is positioned around the second main core leg section. Each bobbin assembly comprises a two-piece bobbin and at least one winding wound around the two-piece bobbin. Each two-piece bobbin includes a first end flange, a second end flange, and a cylindrical passageway. The cylindrical passageway extends between the first and second end flanges. The at least one winding is wound around the two-piece bobbin between the first and second end flanges.

In certain embodiments of the common mode choke assembly, the two-piece bobbin has a mating surface. The mating surface divides the two-piece bobbin into a first bobbin piece and a second bobbin piece. Each of the first and second bobbin pieces has a respective mating surface. The mating surface is divided by a cross-sectional portion of the cylindrical passageway.

In certain embodiments of the common mode choke assembly, the two-piece bobbin includes at least one intermediate flange. The at least one intermediate flange is positioned between the first and second end flanges.

In certain embodiments of the common mode choke assembly, the first end flange of the two-piece bobbin includes a first outer flange surface. The first outer flange surface has an extruded sprocket portion disposed circumferentially around the cylindrical passageway. The extruded sprocket portion is engageable to rotate the two-piece bobbin relative to the main core in order to assist in winding the at least one winding onto the two-piece bobbin.

In certain embodiments, the common mode choke assembly further includes a mounting header. The mounting header has a top header surface and a bottom header surface. The mounting header includes a plurality of pins attached to and extending perpendicularly from the bottom header surface. The main core and shunt core are configured to be positioned on the top header surface of the mounting header. The mounting header includes a plurality of slots. The plurality of slots are configured to allow passage of the at least one winding of each of the first bobbin assembly and the second bobbin assembly. The plurality of slots allow the at least one winding to connect to at least one of the plurality of pins.

Another embodiment disclosed herein is a method of assembling a common mode choke assembly. The method includes the step of providing an integrally formed main core. The main core includes a generally rectangular main core body, a first core riser portion, and a second core riser portion. The main core body includes a first main core end section and a second main core end section. The second main core end section is parallel to and spaced apart from the first main core end section. The main core body further includes a first main core leg section and a second main core leg section. The second main core leg section is parallel to and spaced apart from the first main core leg section. Each of the first and second main core leg sections extends perpendicularly from a first inner surface of the first main core end section to a second inner surface of the second main core end section. The first core riser portion extends perpendicularly downward from the first main core end section.

The first core riser portion has a first riser notch. The second core riser portion extends perpendicularly downward from the second main core end section. The second core riser portion has a second riser notch. The second riser notch is in alignment with the first rise notch.

The method further includes the step of positioning a shunt core within the first and second core notches. The shunt core has a length selected to extend from a first core riser outer surface of the first core riser portion to a second core riser outer surface of the second core riser portion.

The method further includes the step of providing a first two-piece bobbin and a second two-piece bobbin. Each bobbin has a first end flange, a second end flange, and a cylindrical passageway. The cylindrical passageway extends between the first and second end flanges.

The method further includes the step of positioning a first bobbin piece and a second bobbin piece of the first two-piece bobbin around the first main core leg section until each piece is engaged with the other. The first main core leg section is configured to slidably fit within the cylindrical passageway of the first two-piece bobbin.

The method further includes the step of rotating the first two-piece bobbin with respect to the first main core leg section to wind at least one winding onto the first two-piece bobbin between the first end flange and the second end flange.

The method further includes the step of positioning a first bobbin piece and a second bobbin piece of the second two-piece bobbin around the second main core leg section until each piece is engaged with the other. The second main core leg section is configured to slidably fit within the cylindrical passageway of the second two-piece bobbin.

The method further includes the step of rotating the second two-piece bobbin with respect to the second main core leg section to wind at least one winding onto the second two-piece bobbin between the first end flange and the second end flange.

In certain embodiments, the method further includes the step of positioning the integrally formed main core on a top header surface of a mounting header. The mounting header includes a plurality of pins attached to and extending perpendicularly from a bottom header surface. The first and second core riser portions are configured to engage the top header surface of the mounting header.

DETAILED DESCRIPTION OF THE INVENTION

In the following description, various dimensional and orientation words, such as height, width, length, longitudinal, horizontal, vertical, up, down, left, right, tall, low profile, and the like, may be used with respect to the illustrated drawings. Such words are used for ease of description with respect to the particular drawings and are not intended to limit the described embodiments to the orientations shown. It should be understood that the illustrated embodiments can be oriented at various angles and that the dimensional and orientation words should be considered relative to an implied base plane that would rotate with the embodiment to a revised selected orientation.

Reference will now be made in detail to embodiments of the present disclosure, one or more drawings of which are set forth herein. Each drawing is provided by way of explanation of the present disclosure and is not a limitation. It will be apparent to those skilled in the art that various modifications and variations can be made to the teachings of the present disclosure without departing from the scope of the disclosure. For instance, features illustrated or described as part of one embodiment can be used with another embodiment to yield a still further embodiment.

It is intended that the present disclosure covers such modifications and variations as come within the scope of the appended claims and their equivalents. Other objects, features, and aspects of the present disclosure are disclosed in the following detailed description. It is to be understood by one of ordinary skill in the art that the present discussion is a description of exemplary embodiments only and is not intended as limiting the broader aspects of the present disclosure.

Figure 5:
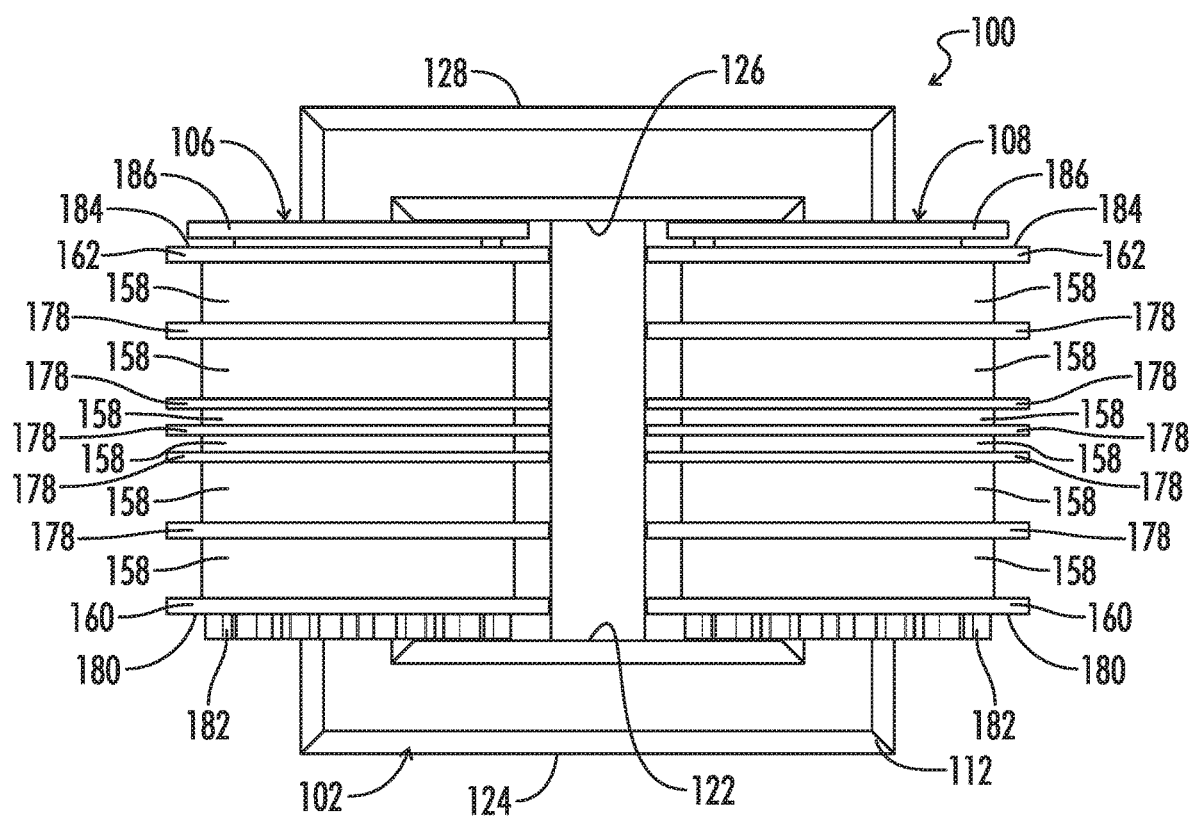
FIG. 5 illustrates a top plan view of the common mode choke of FIG. 1.
Figure 6:
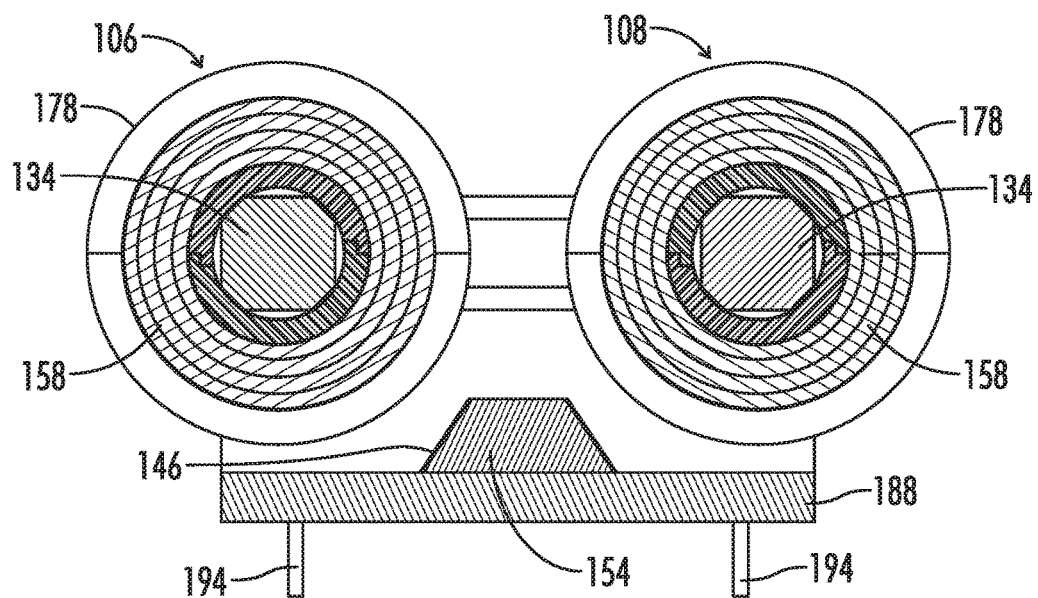
FIG. 6 illustrates a cross-sectional front elevational view of the common mode choke of FIG. 1 taken along line 6-6.
Figure 7:
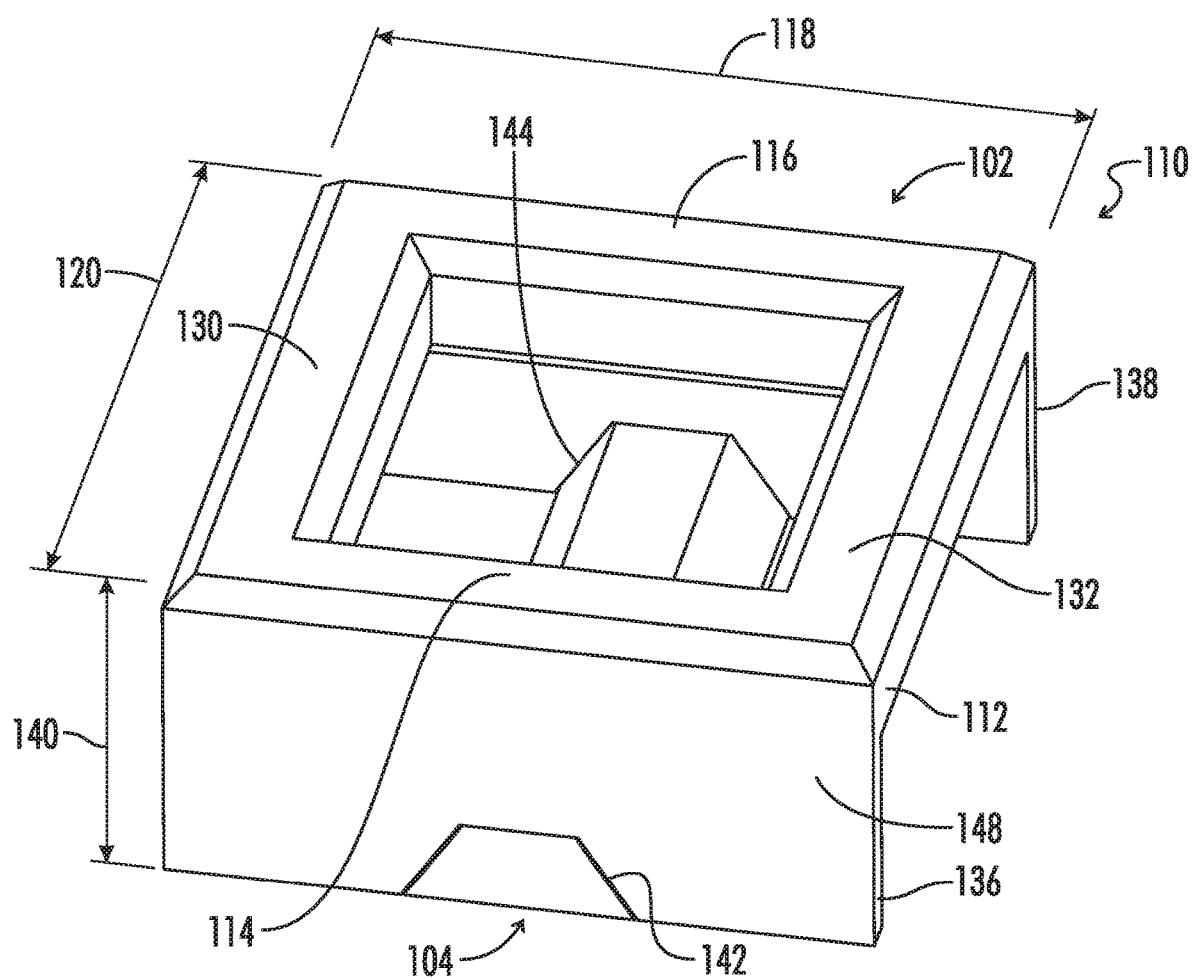
FIG. 7 illustrates a perspective view of a core assembly in accordance with the present disclosure
Figure 8:
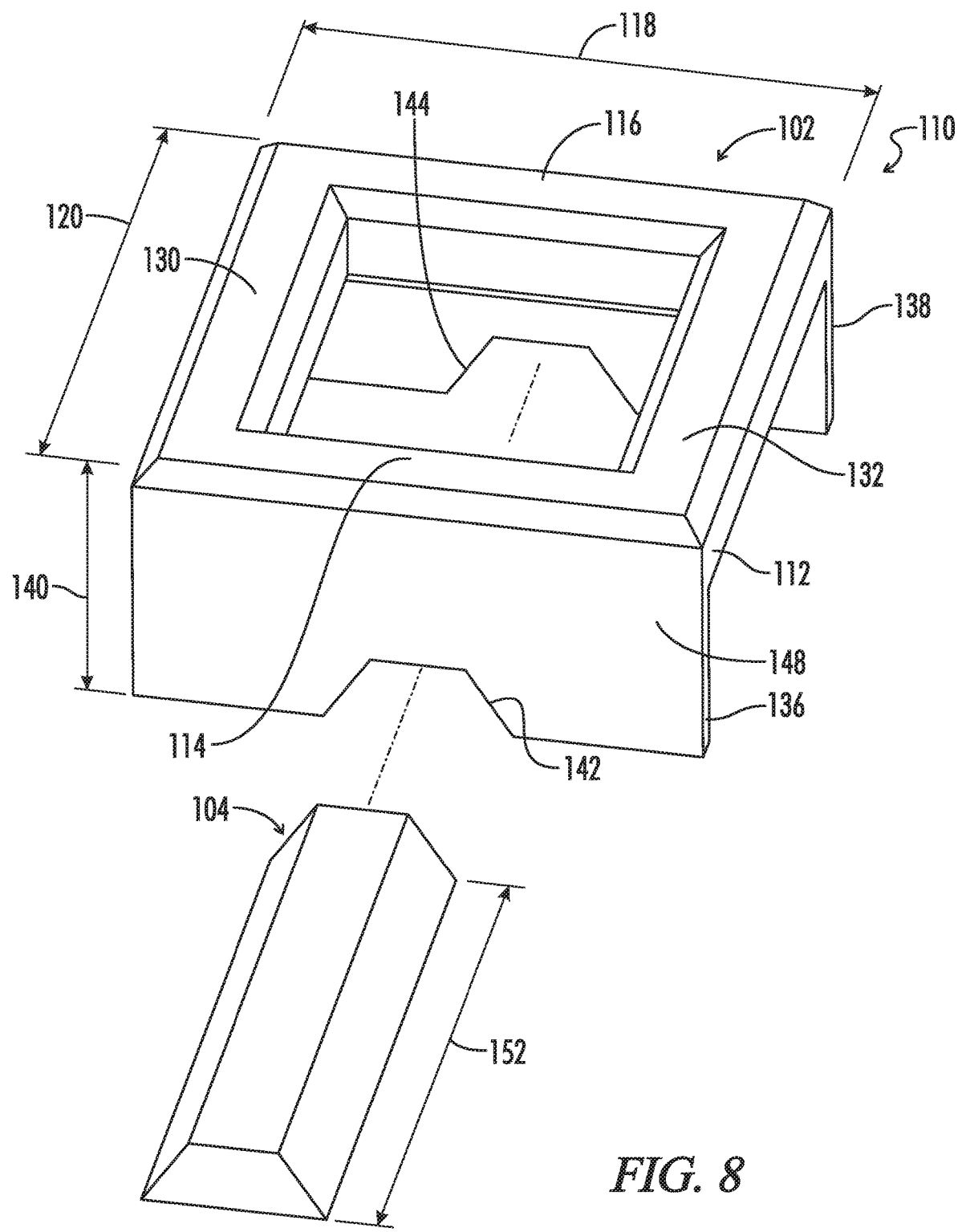
FIG. 8 illustrates an explored perspective view of the core assembly of FIG. 7.

A first embodiment of a common mode choke assembly 100 is shown in FIGS. 1-6. The common mode choke assembly 100 may be referred to as a magnetic assembly 100 or a magnetic device 100. In the first embodiment, the common mode choke assembly 100 includes a main core 102, a shunt core 104, a first bobbin assembly 106, and a second bobbin assembly 108. As shown in FIGS. 7 and 8, a core assembly 110 includes the main core 102 and the shunt core 104.

Figure 1:
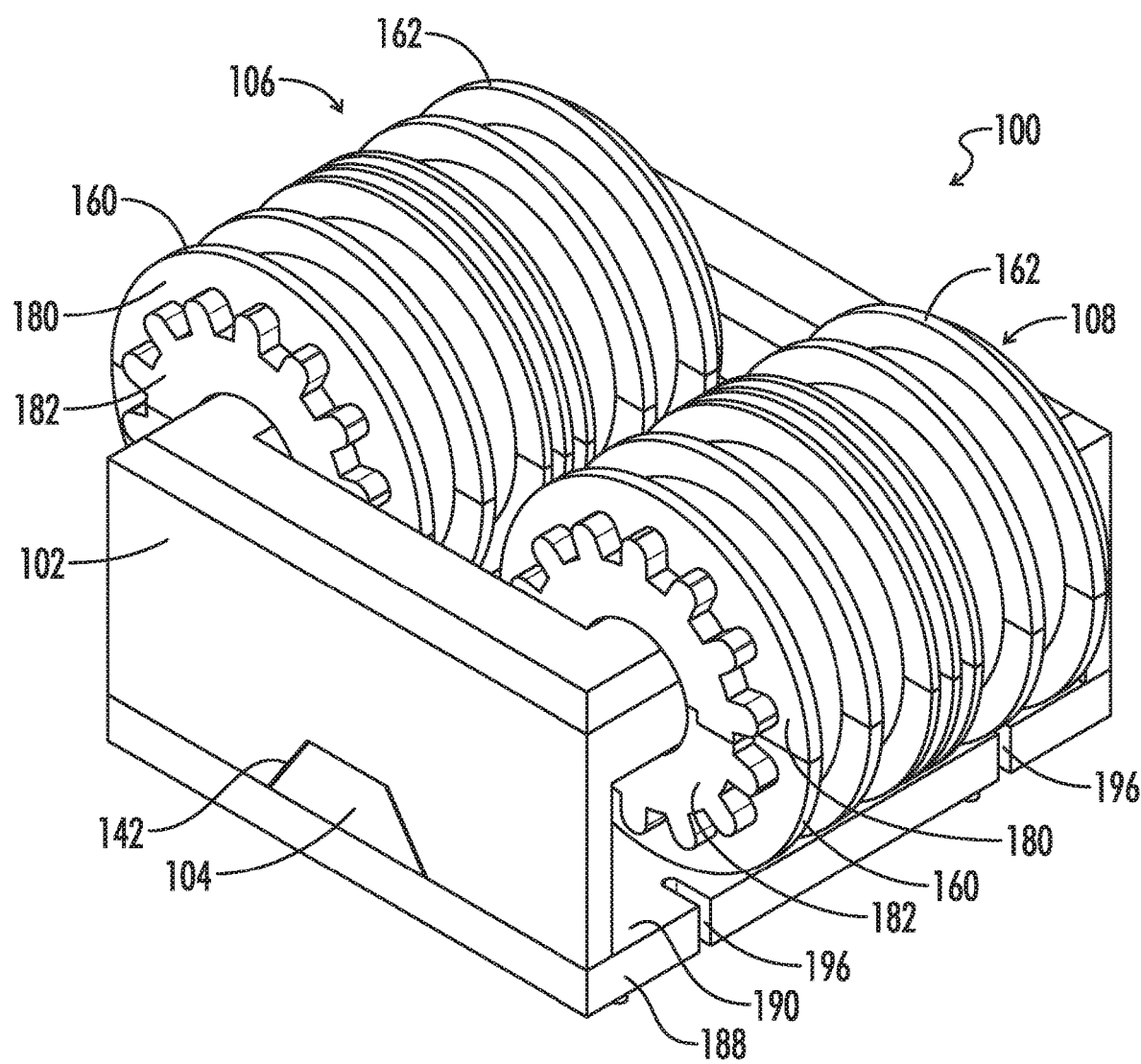
FIG. 1 illustrates a perspective view of a common mode choke in accordance with the present disclosure.
Figure 2:
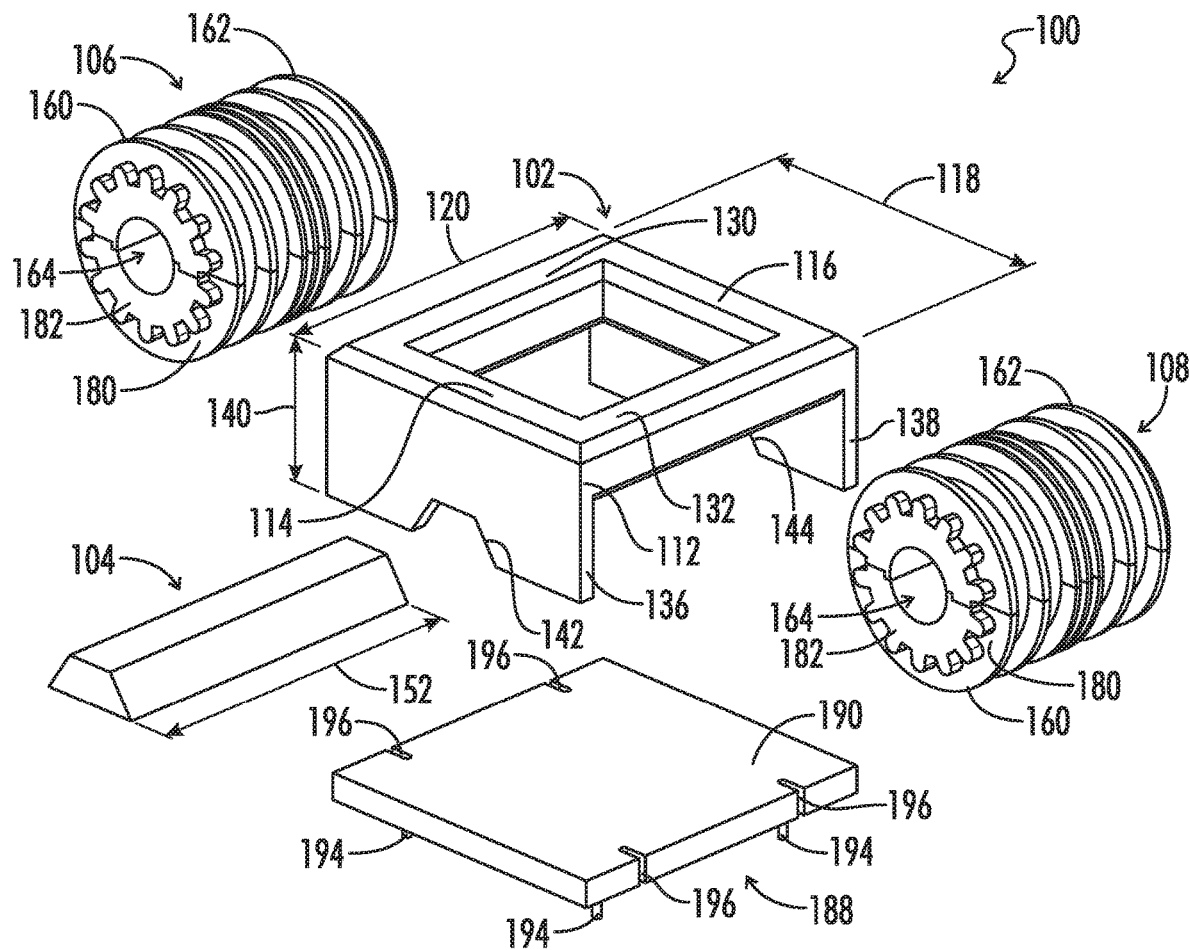
FIG. 2 illustrates an exploded perspective view of the common mode choke of FIG. 1.

In the first embodiment, the main core 102 of the common mode choke assembly 100 includes a generally rectangular main core body 112, as shown in FIGS. 2, 7, and 8. The main core body 112 includes a first main core end section 114 and a second main core end section 116. The first main core end section 114 and the second main core end section 116 are parallel to each other and parallel to a first direction 118. The first main core end section 114 and the second main core end section 116 are spaced apart in a second direction 120. The second direction 120 is orthogonal to the first direction 118. The first main core end section 114 has a first inner surface 122 and a first outer surface 124. The second main core end section 116 has a second inner surface 126 and a second outer surface 128.

The main core body 112 of the common mode choke assembly 100 further includes a first main core leg section 130 and a second main core leg section 132, as shown in FIGS. 2, 7, and 8. The first main core leg section 130 and the second main core leg section 132 are parallel to the second direction 120. The first main core leg section 130 and second main core leg section 132 are spaced apart along the first direction 118. Each of the first main core leg section and second main core leg section extends from the first inner surface 122 of the first main core end section 114 to the second inner surface 126 of the second main core end section 116. The first main core leg section 130 and second main core leg section 132 have a core leg cross-sectional profile 134, as shown in FIG. 6 only.

The main core body 112 of the common mode choke assembly 100 further includes a first core riser portion 136 and a second core riser portion 138, as shown in FIGS. 2, 7, and 8. The first core riser portion 136 extends perpendicularly downward from the first main core end section 114 in a third direction 140. The third direction 140 is orthogonal to both the first direction 118 and the second direction 120. The first core riser portion 136 has a first riser notch 142. The second core riser portion 138 extends perpendicularly downward from the second main core end section 116 in the third direction 140. The second core riser 138 has a second riser notch 144. The first riser notch 142 and the second riser notch 144 are in alignment with respect to the second direction 120. The first riser notch 142 and the second riser notch 144 have a riser notch profile 146, which is shown in FIG. 6 only.

As shown in FIGS. 2, 4, 7, and 8, the first core riser portion 136 has a first core riser outer surface 148. The first core riser outer surface 148 is in alignment with the first outer surface 124 of the first main core end section 114. The second core riser portion 138 has a second core riser outer surface 150. The second core riser outer surface 150 is in alignment with the second outer surface 128 of the second main core end section 116.

Figure 3:
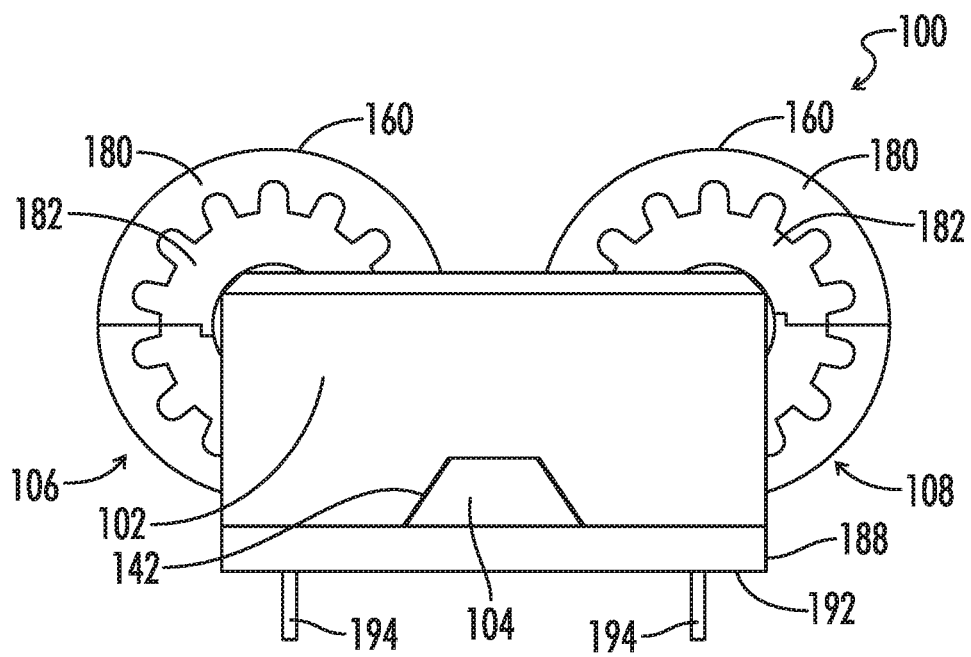
FIG. 3 illustrates a front elevational view of the common mode choke of FIG. 1.

In the first embodiment, the shunt core 104 of the common mode choke assembly 100 has a length 152 (FIGS. 2 and 8), which is selected to extend from the first outer surface 124 of the first main core end section 114 to the second outer surface 128 of the second main core end section 116. The shunt core 104 has a cross-sectional shunt profile 154, as shown in FIGS. 3 and 6. The cross-sectional shunt profile 154 is configured to conform to the core riser notch profile 146. The shunt core 104 is configured to fit snugly within the first riser notch 142 and the second riser notch 144.

As shown in FIGS. 3 and 6, the core riser notch profile 146 is trapezoidal, and the cross-sectional shunt core profile 154 is trapezoidal. The trapezoidal shape is used to make the common mode choke assembly 100 compact and low profile. The trapezoidal shape also allows the cross-sectional shunt core profile 154 to be larger without interfering with the first and second bobbin assemblies 106, 108. In other embodiments, the core riser notch profile 146 and the cross-sectional shunt core profile 154 may have a non-trapezoidal shape (e.g., semi-circular, rectangular, triangular, or the like).

Figure 9:
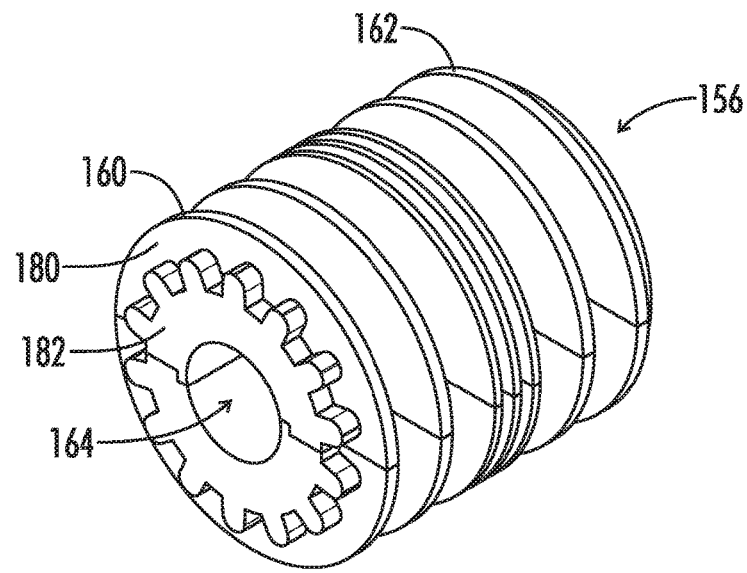
FIG. 9 illustrates a perspective view of a two-piece bobbin in accordance with the present disclosure.
Figure 10:
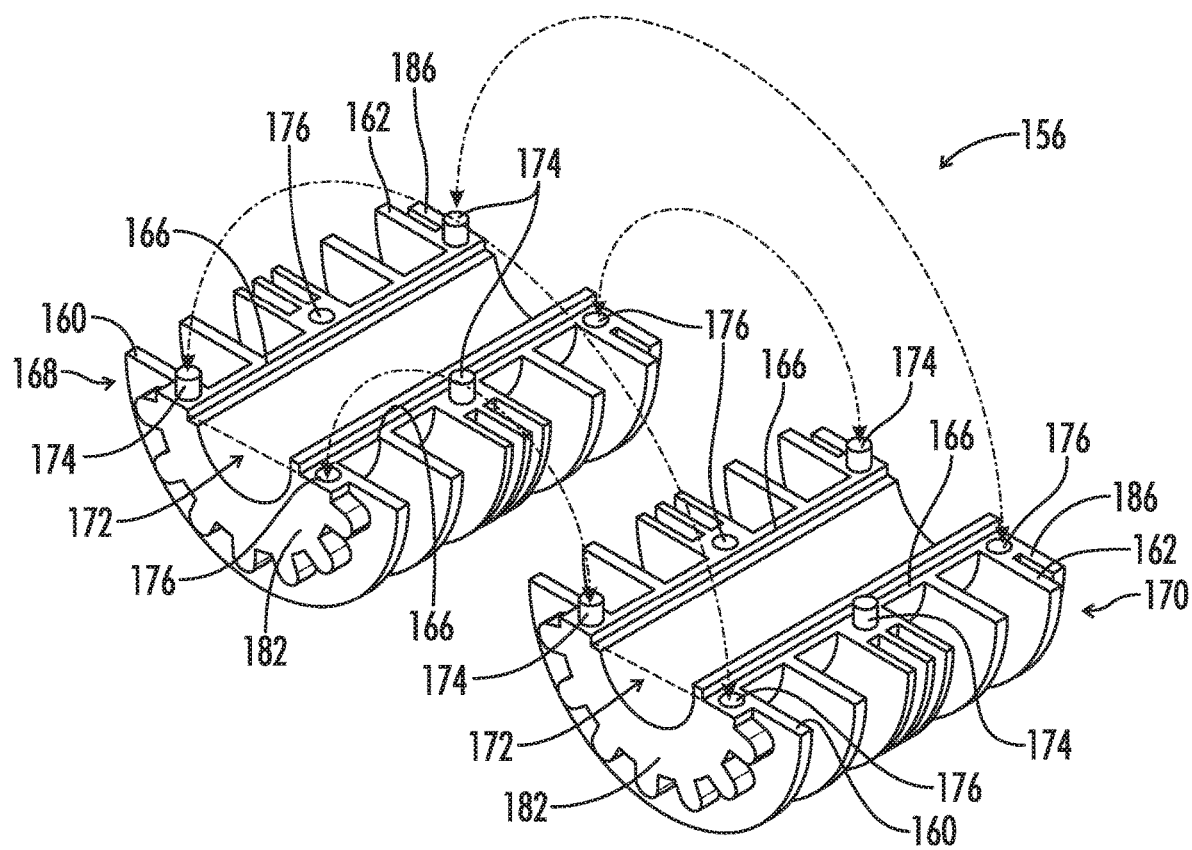
FIG. 10 illustrates a perspective view of the two-piece bobbin of FIG. 9 prior to mechanical interconnection of the two bobbin pieces at the mating surfaces.

In the first embodiment, the first bobbin assembly 106 is positioned around the first main core leg section 130, and the second bobbin assembly 108 is positioned around the second main core leg section 132. Each bobbin assembly 106, 108 includes a respective two-piece bobbin 156 and at least one winding 158 (FIGS. 5 and 6 only), which is wound around the respective two-piece bobbin 156. As shown in FIGS. 9 and 10, the two-piece bobbin 156 includes a first end flange 160 and a second end flange 162. As shown in FIGS. 2 and 9, the two-piece bobbin 156 further includes a cylindrical passageway 164 extending between the first end flange 160 and the second end flange 162. The at least one winding 158 is wound around the two-piece bobbin 156 between the first end flange 160 and the second end flange 162.

As shown in FIGS. 9 and 10, each two-piece bobbin 156 has a mating surface 166. As shown in FIG. 10, the mating surface divides the two-piece bobbin 156 into a first bobbin piece 168 and a second bobbin piece 170. The mating surface 166 is divided by a cross-sectional portion 172 of the cylindrical passageway 164. In the illustrated embodiment, the mating surface 156 includes at least one protrusion 174 and at least one receptacle 176 associated with each of the first bobbin piece 168 and the second bobbin piece 170. The at least one protrusion 174 and the at least one receptacle 176 of the first bobbin piece 168 are configured to engage a corresponding protrusion 174 and a corresponding receptacle 176 of the second bobbin piece 170. The at least one protrusion 174 and at least one receptacle 176 assist in alignment of the first bobbin piece 168 and the second bobbin piece 170 during assembly. In other embodiments, not shown, alignment assistance can be accomplished with different structures (e.g., ridges, or the like) or may be accomplished by the shape of the mating surface 166 itself.

The cylindrical passageway 164 of each two-piece bobbin 156 is configured to slidably receive either the first main core leg section 130 or the second main core leg section 132. As shown in FIG. 6, the core leg cross-sectional profile 134 of each of the first main core leg section 130 and the second main core leg section 132 is octagonal. The core leg cross-sectional profiles 134 may also be described as generally square with four beveled edges. The shape of the core leg cross-sectional profile 134 is selected to minimize empty space in the cylindrical passageway 164 and to reduce friction created by rotating the two-piece bobbin 156 with respect to the main core 102. In certain embodiments, the core leg cross-sectional profile 134 may be shaped differently (e.g., circular, triangular, square, hexagonal, or the like).

In the illustrated embodiment, the two-piece bobbin 156 includes at least one intermediate flange 178, which is shown in FIGS. 5 and 6. The at least one intermediate flange 178 is positioned between the first end flange 160 and the second end flange 162.

In the illustrated embodiment, the first end flange 160 of the two-piece bobbin 156 has an outer first flange surface 180. The outer first flange surface 180 of the first end flange 160 includes an extruded sprocket portion 182. The extruded sprocket portion 182 is disposed circumferentially around the cylindrical passageway 164. The extruded sprocket portion 182 is configured to be engaged to rotate the two-piece bobbin 156 to assist in winding the at least one winding 158 onto the two-piece bobbin 156.

Figure 4:
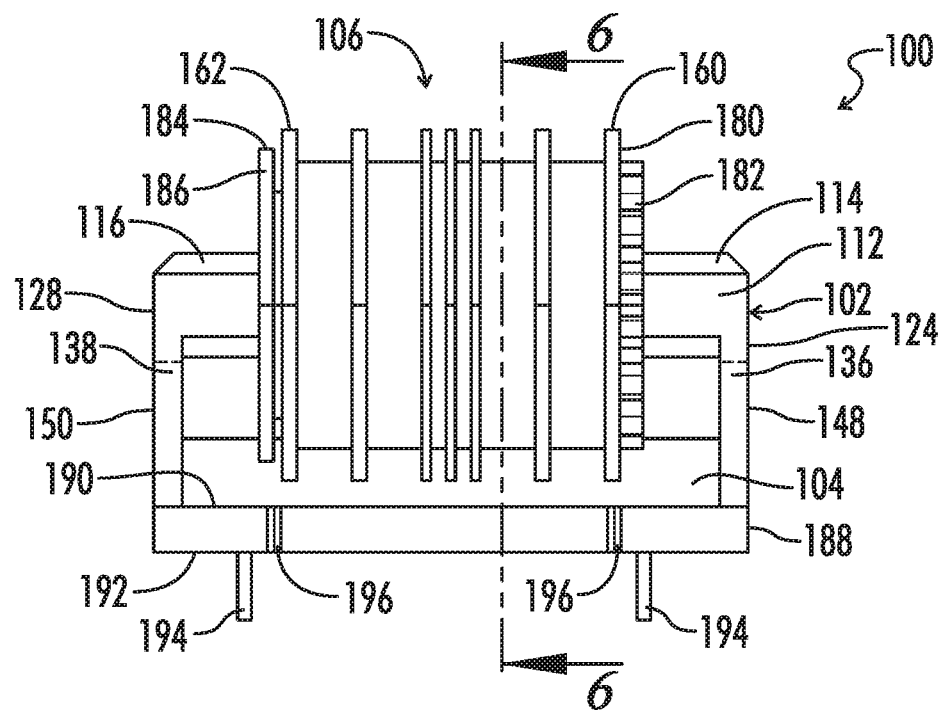
FIG. 4 illustrates a left side elevational view of the common mode choke of FIG. 1.

As shown in FIGS. 4-5, the second end flange 162 of the two-piece bobbin 156 has an outer second flange surface 184. The outer second flange surface 184 of the second end flange 162 includes an extruded circular portion 186. The extruded circular portion 186 is disposed circumferentially around the cylindrical passageway 164. The extruded circular portion 186 is used to center the at least one winding 158 with respect to the main core 102.

In the illustrated embodiment, each respective two-piece bobbin 156 of the first bobbin assembly 106 and the second bobbin assembly 108 is structurally identical, but can be different. In some embodiments (not shown), the two-piece bobbin 156 of the first bobbin assembly 106 may be longer than the two-piece bobbin 156 of the second bobbin assembly 108. In other embodiments (not shown), the two-piece bobbin 156 of the first bobbin assembly 106 may include more or fewer intermediate flanges 178 than the two-piece bobbin 156 of the second bobbin assembly 108.

Figure 11:
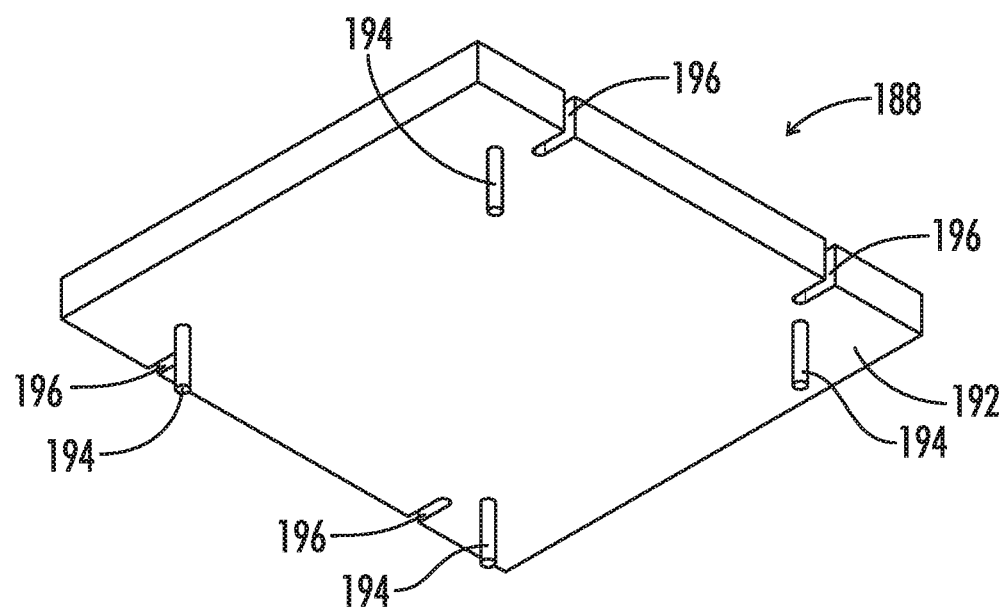
FIG. 11 illustrates a perspective view of a bottom surface of the mounting header in accordance with the present embodiment.

In the first embodiment, the common mode choke assembly 100 includes a mounting header 188. The mounting header 188 has a top header surface 190 and a bottom header surface 192 (FIG. 11). The mounting header 188 further includes a plurality of pins 194. The plurality of pins 194 are attached to and extend perpendicularly from the bottom header surface 192 of the mounting header 188. The main core 102 and shunt core 104 are configured to be positioned on the top header surface 190. The mounting header 188 further includes a plurality of slots 196 configured to allow passage of the at least one winding 158 of each of the first bobbin assembly 106 and second bobbin assembly 108 to connect to at least one pin of the plurality of pins 194.

In certain embodiments, the main core 102 of the common mode choke assembly 100 is integrally formed from a high permeability ferrite material (not shown) to maximize inductance. Permeability is the inductance per unit length, and is the measure of the ability of a material to support the formation of a magnetic field within itself. Higher permeability results in a lower amount of energy stored in the core, thus resulting in lower core loss and higher efficiency. Maximizing inductance is important for resisting or opposing the rate of change of current while passing steady state DC current. Efficiency is further enhanced by integrally forming the main core 102 because by eliminating the mating surfaces on the main core 102 no stray fields are created which may cause losses in the at least one winding 158.

In the illustrated embodiment, the shunt core 104 of the common mode choke assembly 100 is integrally formed from an iron powder material (not shown) for differential noise suppression. The iron powder material is configured to distribute the gap, thus eliminating the need for an actual air gap. Eliminating the air gap eliminates losses due to the stray flux and thus eliminates losses in the at least one winding 158. A core made from iron powder material creates less stray fields than a ferrite core.

Positioning the windings 158 on separate legs of the rectangular main core 102 results in low inter-winding capacitance. Sectioned bobbins (e.g., multiple windings 158 separated by intermediate flanges 178) results in lower intra winding capacitance. Both features contribute to a higher resonant frequency The common mode choke assembly 100 is assembled by providing the integrally formed main core 102. The main core 102 includes the generally rectangular main core body 112, the first core riser portion 136, and the second core riser portion 138. The main core body 112 includes the first main core end section 114, the second main core end section 116, the first main core leg section 130, and the second main core leg section 132. The first core riser portion has the first riser notch 142. The second core riser portion has the second riser notch 144. The shunt core is then positioned within the first and second notches 142, 144. The shunt core extends from the first core riser outer surface 148 to the second core riser outer surface 150. The two-piece bobbin 156 of the first bobbin assembly 106 is then provided. The two-piece bobbin 156 includes the first end flange 160, the second end flange 162, the cylindrical passageway 164, the mating surface 166, and the first and second bobbin pieces 168, 170. The first bobbin piece 168 and second bobbin piece 170 of the first bobbin assembly 106 are then positioned around the first main core leg section 130 until each piece is engaged with the other and the cylindrical passageway 164 has received the first main core leg section 130. The two-piece bobbin 156 of the first bobbin assembly 106 is then rotated with respect to the first main core leg section 130 to wind the at least one winding 158 of the first bobbin assembly 106 into the two-piece bobbin 156 between the first end flange 160 and the second end flange 162.

The common mode choke assembly 100 is further assembled by providing the two-piece bobbin 156 of the second bobbin assembly 108. The two-piece bobbin 156 includes the first end flange 160, the second end flange 162, the cylindrical passageway 164, the mating surface 166, and the first and second bobbin pieces 168, 170. The first bobbin piece 168 and second bobbin piece 170 of the second bobbin assembly 108 are then positioned around the second main core leg section 132 until each piece is engaged with the other and the cylindrical passageway 164 has received the second main core leg section 132. The two-piece bobbin 156 of the second bobbin assembly 108 is then rotated with respect to the second main core leg section 132 to wind the at least one winding 158 of the second bobbin assembly 108 into the two-piece bobbin 156 between the first end flange 160 and the second end flange 162.

The common mode choke assembly 100 is further assembled by positioning the main core 102 and the shunt core 104 on the upper header surface 190 of the mounting header 188. The first and second core riser portions 136, 138 are configured to engage the top header surface 190 of the mounting header 188. The mounting header 188 includes the plurality of pins 194 attached to and extending perpendicularly from the lower header surface 192.

Thus, although there have been described particular embodiments of the present invention of a new and useful COMPACT COMMON MODE CHOKE WITH DIFFERENTIAL NOISE SUPPRESSION AND HIGH SELF RESONANT FREQUENCY it is not intended that such references be construed as limitations upon the scope of this invention except as set forth in the following claims.

What is claimed is:

1. A common mode choke assembly comprising:
    a main core comprising
        a generally rectangular main core body comprising a first main core end section, a second main core end section parallel to and spaced apart from the first main core end section, a first main core leg section and a second main core leg section, the first and second main core leg sections parallel to each other and spaced apart from each other, each of the first and second main core leg sections extending perpendicularly from a first inner surface of the first main core end section to a second inner surface of the second main core end section;
        a first core riser portion extending perpendicularly downward from the first main core end section, the first core riser having a first riser notch,
        a second core riser portion extending perpendicularly downward from the second main core end section, the second core riser having a second riser notch, the second riser notch is in alignment with the first riser notch;
    a shunt core configured to be positioned within the first and second riser notches, the shunt core having a length selected to extend from a first outer surface of the first core riser portion to a second outer surface of the second core riser portion; and
    a first bobbin assembly positioned around the first main core leg section and a second bobbin assembly positioned around the second main core leg section, each bobbin assembly comprising a two-piece bobbin and at least one winding wound around the two-piece bobbin, wherein each two-piece bobbin includes a first end flange, a second end flange, and a cylindrical passageway extending between the first and second end flanges, and wherein the at least one winding is wound around the two-piece bobbin between the first and second end flanges.

2. The common mode choke assembly of claim 1, wherein the two-piece bobbin has a mating surface dividing the two-piece bobbin into a first bobbin piece and a second bobbin piece, the first and second bobbin pieces each have a mating surface, the mating surface divided by a cross-sectional portion of the cylindrical passageway.

3. The common mode choke assembly of claim 1, wherein the two-piece bobbin includes at least one intermediate flange positioned between the first and second end flanges.

4. The common mode choke assembly of claim 1, wherein the first end flange of the two-piece bobbin includes a first outer flange surface having an extruded sprocket portion disposed circumferentially around the cylindrical passageway.

5. The common mode choke assembly of claim 4, wherein the extruded sprocket portion is engage able to rotate the two-piece bobbin relative to the main core in order to assist in winding the at least one winding onto the two-piece bobbin.

6. The common mode choke assembly of claim 1, further comprising a mounting header having a top header surface and a bottom header surface, the mounting header including a plurality of pins attached to and extending perpendicularly from the bottom header surface, wherein the main core and shunt core are configured to be positioned on the top header surface of the mounting header.

7. The common mode choke assembly of claim 6, wherein the mounting header includes a plurality of slots configured to allow passage of the at least one winding of each of the first bobbin assembly and the second bobbin assembly to connect to at least one pin of the plurality of pins.

\* \* \* \* \*